United States Patent
Dai et al.

(10) Patent No.: US 9,478,579 B2
(45) Date of Patent: Oct. 25, 2016

(54) STACKED CHIP IMAGE SENSOR WITH LIGHT-SENSITIVE CIRCUIT ELEMENTS ON THE BOTTOM CHIP

(71) Applicant: OMNIVISION TECHNOLOGIES, INC., Santa Clara, CA (US)

(72) Inventors: Tiejun Dai, Santa Clara, CA (US); Guannho George Tsau, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 87 days.

(21) Appl. No.: 14/033,293

(22) Filed: Sep. 20, 2013

(65) Prior Publication Data

US 2014/0103411 A1    Apr. 17, 2014

Related U.S. Application Data

(60) Provisional application No. 61/714,665, filed on Oct. 16, 2012.

(51) Int. Cl.
*H01L 27/146*    (2006.01)

(52) U.S. Cl.
CPC ..... *H01L 27/14643* (2013.01); *H01L 27/1464* (2013.01); *H01L 27/14609* (2013.01); *H01L 27/14634* (2013.01)

(58) Field of Classification Search
CPC ............ H01L 27/14643; H01L 27/1464; H01L 27/14609; H01L 27/14634; H01L 21/2007; H01L 33/0079
USPC ........ 257/290, 291, 292, 293, 294; 438/116, 438/118, 406, 455
See application file for complete search history.

(56) References Cited

U.S. PATENT DOCUMENTS 6,927,432 B2 *   8/2005   Holm .................. H01L 27/1463
                                                               257/257
7,361,877 B2     4/2008   McGrath et al.
(Continued)

FOREIGN PATENT DOCUMENTS

TW           200803484 A        1/2008

OTHER PUBLICATIONS

TW 102137191—First Office Action with English Translation, issued Sep. 30, 2015, 17 pages.
(Continued)

*Primary Examiner* — Jarrett Stark
*Assistant Examiner* — Shahed Ahmed
(74) *Attorney, Agent, or Firm* — Blakely Sokoloff Taylor & Zafman LLP

(57) ABSTRACT

An example imaging sensor system includes a backside-illuminated CMOS imaging array formed in a first semiconductor layer of a first wafer. The CMOS imaging array includes an N number of pixels, where each pixel includes a photodiode region. The first wafer is bonded to a second wafer at a bonding interface between a first metal stack of the first wafer and a second metal stack of the second wafer. A storage device is disposed in a second semiconductor layer of the second wafer. The storage device includes at least N number of storage cells, where each of the N number of storage cells are configured to store a signal representative of image charge accumulated by a respective photodiode region. Each storage cell includes a circuit element that is sensitive to light-induced leakage.

12 Claims, 13 Drawing Sheets

(56) References Cited

U.S. PATENT DOCUMENTS

| | | |
|---|---|---|
| 8,049,256 B2 | 11/2011 | Guidash |
| 8,089,036 B2 | 1/2012 | Manabe |
| 8,445,828 B2 | 5/2013 | He |
| 8,933,544 B2 | 1/2015 | Mao et al. |
| 8,946,610 B2 | 2/2015 | Iwabuchi et al. |
| 2008/0210982 A1 | 9/2008 | Han |
| 2009/0042365 A1* | 2/2009 | McDonald ........ H01L 21/76898 438/459 |
| 2009/0201400 A1* | 8/2009 | Zhang ............... H01L 27/14609 348/296 |
| 2010/0097477 A1* | 4/2010 | Lee ..................... H04N 17/002 348/187 |
| 2010/0230729 A1 | 9/2010 | Ellis-Monaghan et al. |
| 2011/0043499 A1* | 2/2011 | Cok ....................... G09G 3/006 345/205 |
| 2012/0001060 A1 | 1/2012 | He |
| 2013/0320197 A1* | 12/2013 | Asayama .............. H01L 25/167 250/208.1 |

OTHER PUBLICATIONS

CN 201310481663.5—First Office Action and Search Report with English Translation, issued Dec. 28, 2015, 20 pages.
CN 201310481663.5—Second Office Action and English Translation, issued Jul. 22, 2016, 11 pages.

* cited by examiner

US 9,478,579 B2

STACKED CHIP IMAGE SENSOR WITH LIGHT-SENSITIVE CIRCUIT ELEMENTS ON THE BOTTOM CHIP

CROSS-REFERENCE TO RELATED APPLICATION

This application claims the benefit of U.S. Provisional Application No. 61/714,665, filed Oct. 16, 2012.

TECHNICAL FIELD

This application relates to image sensors, more specifically CMOS image sensor in a stacked chip formation. The top chip includes a CMOS imaging array. The bottom chip includes light-sensitive circuit elements that need to be shielded from light.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors.

Some conventional image sensors incorporate in-pixel memory. For example, U.S. Pat. No. 8,445,828, which is incorporated herein by reference, describes a high dynamic range CMOS image sensor that incorporates in-pixel memory for varying integration periods. That is, integration periods are determined, in part, by signals stored in the in-pixel memory from previous integration periods. Each pixel includes a memory latch circuit that stores integration period information relating to that pixel. Each of these memory elements can be accessed individually. However, some of the circuit elements incorporated in the in-pixel memory may be sensitive to light-induced leakage.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Stacked Chip Image Sensor with Light-Sensitive Circuit Elements on the Bottom Chip are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "down", "above", "below" are used with reference to the orientation of the figure(s) being described.

Figure 1:
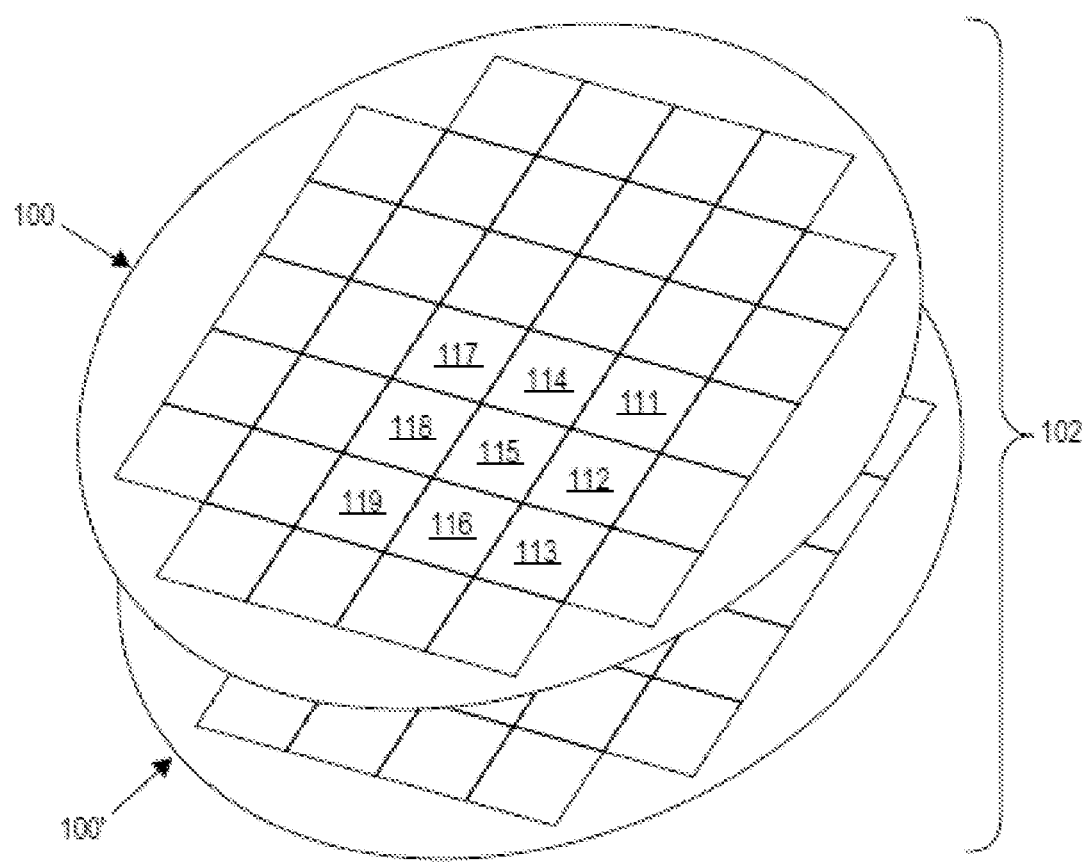
FIG. 1 is an exploded view of stacked semiconductor wafers with integrated circuit dies, in accordance with an embodiment of the invention.

FIG. 1 is an exploded view of stacked device wafers 100 and 100' that are to be bonded together to form an integrated circuit system 102, in accordance with an embodiment of the invention. Device wafers 100 and 100' may include silicon, or gallium arsenide or other semiconductor materials. In the illustrated example, device wafer 100 includes semiconductor dies 111-119 while device wafer 100' includes corresponding semiconductor dies (view obscured in FIG. 1). As will be discussed in more detail below, in some embodiments, each die 111-119 of device wafer 100 may include a backside illuminated CMOS imaging array, while each corresponding die of device wafer 100' includes a storage device for storing image charge signals accumulated by each photodiode of the CMOS imaging array. The storage device may include circuit elements that are light-sensitive (e.g., sensitive to light induced leakage). Thus, positioning the storage device on the bottom device wafer 100' may naturally provide effective light shielding to these light-sensitive circuit elements without the need to fabricate a dedicated light shield.

Figure 2:
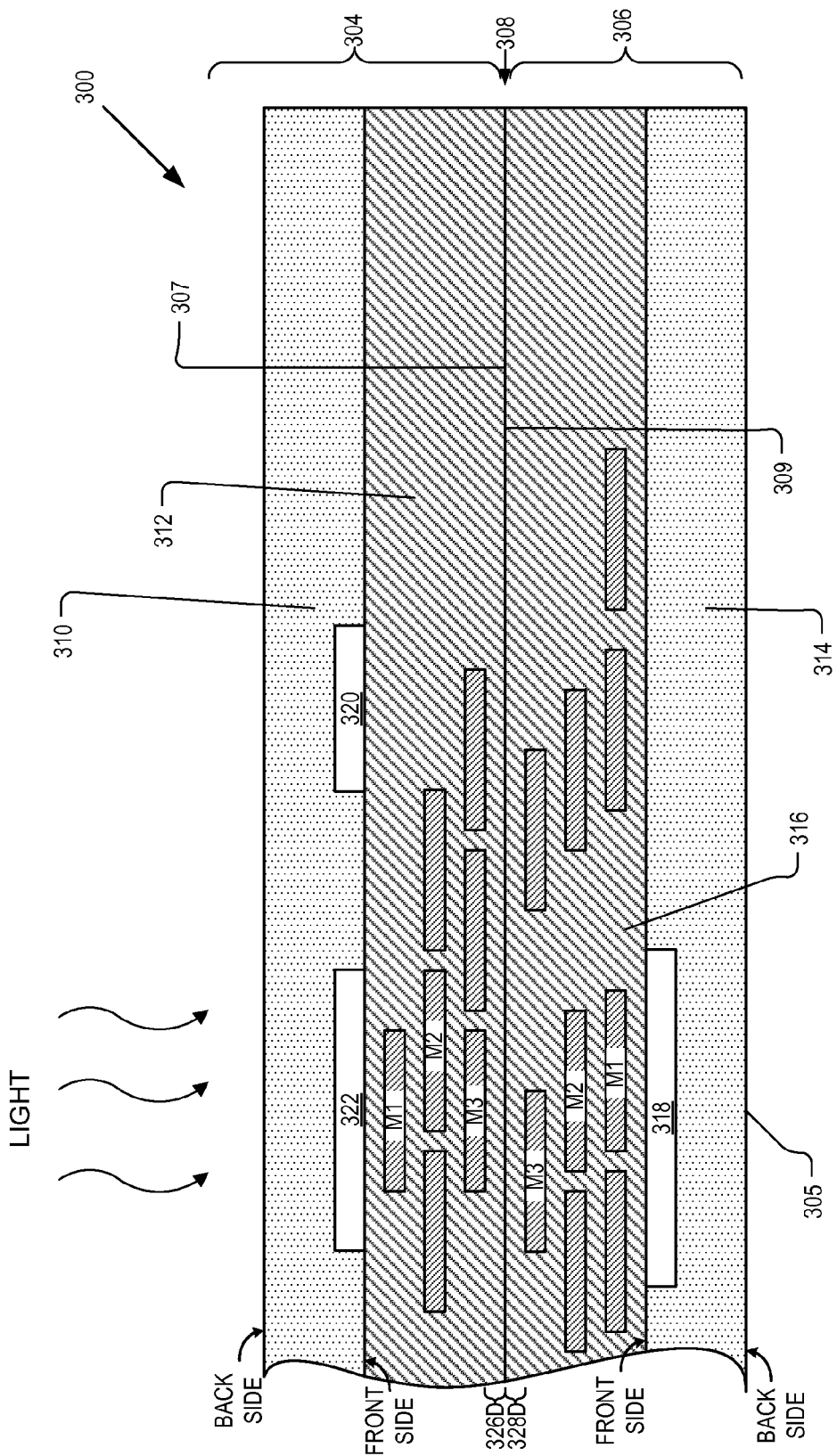
FIG. 2 is a cross-sectional view of an integrated circuit system having stacked device wafers, in accordance with an embodiment of the invention.

FIG. 2 is a cross-sectional view of an integrated circuit system 300 having stacked device wafers 304 and 306, in accordance with an embodiment of the invention. Integrated circuit system 300 is one possible implementation of a portion of integrated circuit system 102 of FIG. 1. The illustrated example of integrated circuit system 300 includes a first device wafer 304, a second device wafer 306, and a bonding interface 308. The first device wafer 304 includes a first semiconductor layer 310 and a first metal stack 312, while the second device wafer 306 is shown as including a second semiconductor layer 314 and a second metal stack 316. Semiconductor layer 310 is shown as including semiconductor devices 322 and 320 and metal stack 312 is shown as including metal layers M1, M2, and M3, and dielectric layer 326D. Semiconductor layer 314 is shown as including semiconductor device 318 and metal stack 316 is shown as including metal layers M1, M2, and M3, and dielectric layers 328D.

In one embodiment, either or both of semiconductor layer 310 and semiconductor layer 314 are layers of epitaxially grown silicon. As shown, semiconductor layer 314 includes semiconductor device 318 formed in a front side of the semiconductor layer 314, while semiconductor layer 310 includes devices 322 and 320 formed in a front side of semiconductor layer 310. In one embodiment, as will be discussed in more detail below, semiconductor device 322 includes a CMOS imaging array and device 320 includes associated peripheral circuitry, such as a readout circuit, a control circuit, or other function circuitry included in a CMOS image sensor. Continuing with this example, components such as the photosensitive regions (e.g., photodiode regions), are included in the CMOS imaging array of device 322. The photosensitive regions (e.g., photodiode regions) of the CMOS image sensor may formed in the front side and configured to receive light from the backside of semiconductor layer 310. Device 318 may include a storage device, such as the random access memory discussed below with reference to FIG. 3. Thus, device wafers 304 and 306 may be bonded together to form an integrated circuit system, such as an imaging sensor system that includes devices on the first device wafer 304 as well as devices on the second device wafer 306. As will be shown below, devices 318, 320, and 322 may be formed in their respective semiconductor layer prior to bonding the device wafers 304 and 306 together. In one embodiment, one or both of front side 307 and front side 309 is flattened by a chemical mechanical polish. In one embodiment dielectric layers 326D and 328D each comprise an oxide and are bonded together to form bonding interface 308.

Each CMOS image sensor pixel of embodiments disclosed herein employ a stacked chip formation. The top chip includes a photodetector that receives light to produce electrical signals. The bottom chip includes light-sensitive circuit elements that need to be shielded from light. The stacked chips may be physically and electrically bonded together by means such as hybrid bond (e.g., bonding interface 308).

In contrast, some conventional image sensors use a single chip formation. When a conventional image sensor employs a single chip formation, light-sensitive circuit elements must be shielded from light by a photo-shield. Insufficient shielding will cause undesirable leakage from these circuit elements. Embodiments disclosed herein that employ a stacked chip formation, allows the light-sensitive circuit elements to be positioned on the bottom chip without the need for a dedicated photo-shield. For example, in the embodiment of FIG. 2, light-sensitive circuit elements of device 318 are disposed in semiconductor layer 314 without a dedicated photo-shield disposed between the backside of semiconductor layer 310 and device 318. Such a placement provides effective natural light shielding to these circuit elements.

In one embodiment, the top chip (e.g., wafer 304) and the bottom chip (e.g., wafer 306) are physically and electrically bonded together with hybrid bond, which is a term of art in the field. For example, a hybrid bond binds copper to copper, and oxide to oxide.

One embodiment of an integrated circuit system, the bottom chip includes a random access memory network. Conventional CMOS image sensors employ readout circuits that read out pixel signals row by row. In the present invention, electrical signals produced by each pixel's photodetector are stored in a memory device (i.e., storage cell) that is associated with that pixel. The memory devices are arranged in a network to permit random access. Since light may cause leakage to memory devices, they are positioned on the bottom chip so that they are shielded from light.

Figure 3:
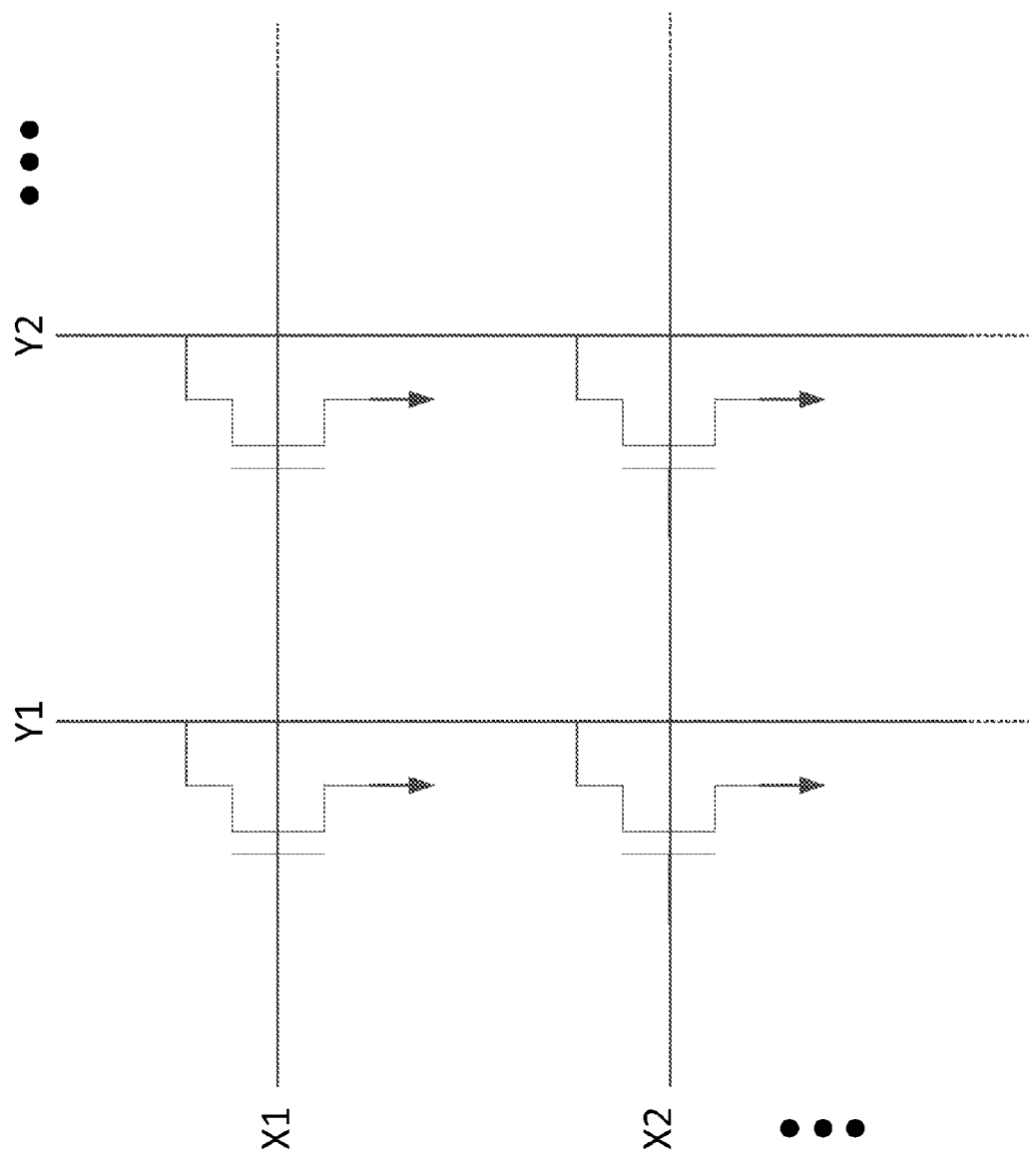
FIG. 3 is a circuit diagram of a random access memory network, in accordance with an embodiment of the invention.

FIG. 3 shows a random access memory network that is positioned on the bottom chip in some embodiments. Each memory transistor is connected to its associated photodetector that is positioned on the top chip. X lines such as X1 and X2 are word lines, and are connected to the gates of each memory. Y lines such as Y1 and Y2 are bit lines, and are used for readout from each memory. Each memory is associated with a single ordered pair such as (X1, Y1) and so on. The random access memory network allows signals from each CMOS image sensor pixel to be read out individually. This is more advantageous than the traditional row by row readout, because it offers more flexibility and versatility to image signal processing.

In additional to storing image signals from each pixel, the random access memory network may also be designed to serve other purposes. For example, it may be designed to control integration periods for each individual pixel as disclosed in US patent application publication 2012/0001060, with the distinction that in present embodiments, the memory elements (e.g., memory latch circuit including M1, M2, and node MEM) are positioned on the bottom chip.

Another embodiment relates to global shutter CMOS image sensors. Conventional CMOS image sensors operate with electronic rolling shutters. In a rolling shutter operational mode, integration of a pixel array occurs row by row, from top to bottom. When the integration of each row is finished, the electrical signals of the row are read out, so the readout of a pixel array also occurs row by row, from top to bottom. Rolling shutter is prone to motion-related artifacts. In contrast, in a global shutter, integration for all the rows of the entire pixel array begins and ends at the same time. The electrical signals are stored, and then read out row by row. Global shutter does not have motion-related artifacts.

In a global shutter CMOS image sensor, electrical signals are stored in storage devices. U.S. Pat. No. 7,361,877, which is incorporated by reference herein, discloses using pinned diodes (e.g., storage region 170) to store photo charges produced by photodiodes. U.S. Pat. No. 8,089,036, which is also incorporated by reference herein, discloses using transistors (e.g., storage transistor 340) to store photo charges. US patent application 2009/0201400, which is again incorporated by reference herein, discloses using capacitors (e.g., storage capacitors C1) to store photo charges. In some embodiments discussed further below, photo charges (i.e., image charge accumulated by a photodiode region) may be stored in any type of storage devices, such as pinned diodes, transistors, and capacitors. When capacitors are used in the following embodiments, transistors are used as switches to access these capacitors. Light may cause diodes and transistors to leak, thereby degrading performance. Thus, these light-sensitive storage device elements, such as transistors functioning as switches, are positioned on the bottom chip so that they are naturally shielded from light.

Figure 4:
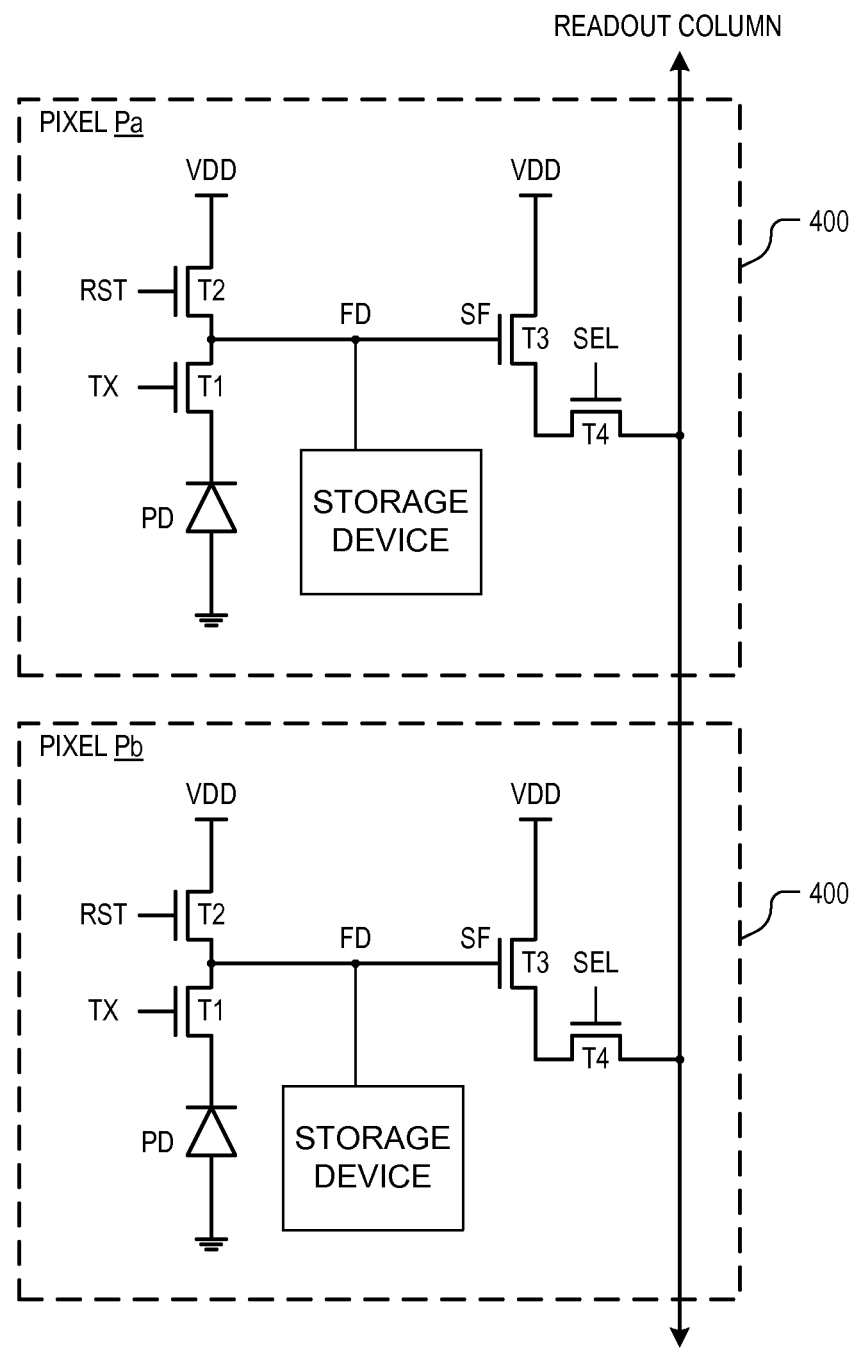
FIG. 4 is a circuit diagram illustrating an embodiment of pixel circuitry 400 of two four-transistor ("4T") pixels within a BSI imaging array, in accordance with an embodiment of the invention.

FIG. 4 is a circuit diagram illustrating an embodiment of pixel circuitry 400 of two four-transistor ("4T") pixels within a BSI imaging array, in accordance with an embodiment of the invention. Pixel circuitry 400 is one possible pixel circuitry architecture for implementing each pixel within a (e.g., pixel array 1305 of FIG. 13), but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 4, BSI pixels Pa and Pb are arranged in two rows and one column. The illustrated embodiment of each pixel circuitry 400 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD can be coupled to a storage device, such as the previously mentioned random access memory located on the bottom chip, for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 400 to the readout column line under control of a select signal SEL. In one embodiment, the TX signal, the RST signal, and the SEL signal are generated by control circuitry.

Figure 5:
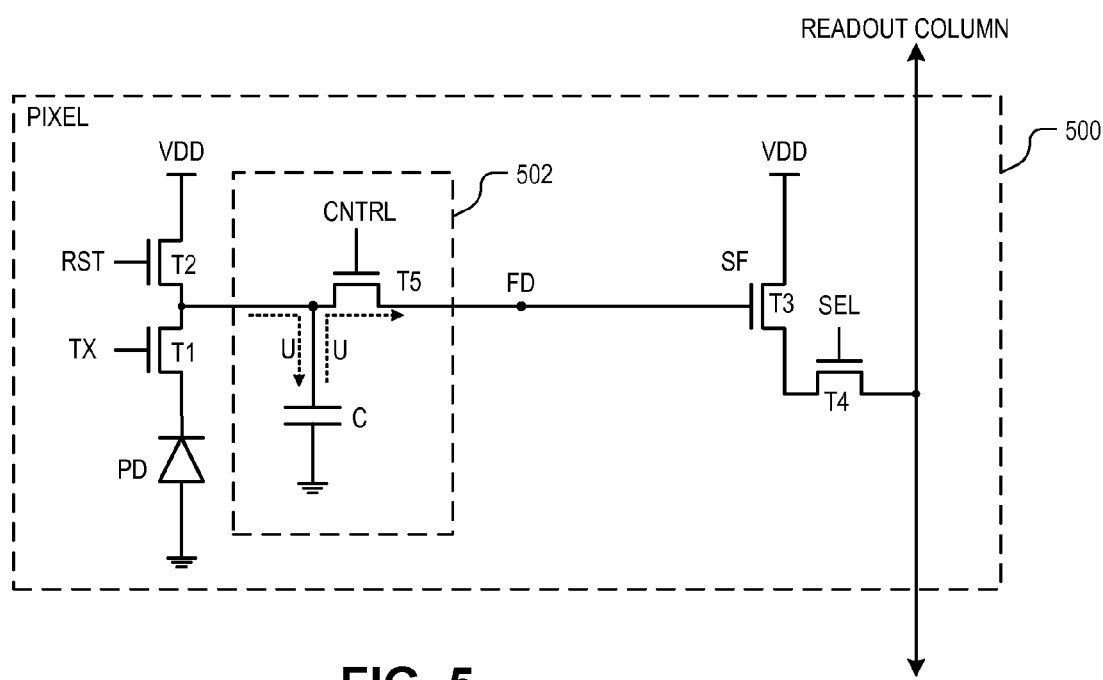
FIG. 5 is a circuit diagram illustrating pixel circuitry of one pixel within a backside illuminated imaging array including storage capacitors, in accordance with an embodiment of the invention.

FIG. 5 is a circuit diagram illustrating pixel circuitry 500 of one pixel within a backside illuminated imaging array, in accordance with an embodiment of the invention. Pixel circuitry 500 is one possible pixel circuitry architecture for implementing each pixel within an pixel array. In FIG. 5, pixel circuitry 500 includes a photodiode PD, a transfer transistor T1, a reset transistor T2, a source-follower ("SF") transistor T3, a select transistor T4, a control transistor T5, and a storage capacitor C. During operation, transfer transistor T1 receives a transfer signal TX, which transfers the charge signal U accumulated in photodiode PD to storage capacitor C. While floating diffusion node FD has an intrinsic capacitance, it is generally not a sufficient replacement for storage capacitor C. For example, the size of floating diffusion FD necessary to achieve sufficient capacitance would result in unacceptable leakage current and other nonlinear characteristics.

Control transistor T5 is coupled to the storage capacitor to control the transfer of the stored signal U out of the storage capacitor to the floating diffusion node FD in response to a control signal CNTRL. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from floating diffusion FD. Finally, select transistor T4 selectively couples the output of pixel circuitry 500 to the readout column line under control of a select signal SEL.

In one embodiment, the TX signal, the RST signal, the CNTRL signal, and the SEL signal are generated by control circuitry. In an embodiment, where the pixel array operates with a global shutter, the global shutter signal is coupled to the gate of each transfer transistor in the entire pixel array to simultaneously commence charge transfer between each pixel's photodiode PD and storage capacitor C. In one embodiment, the global shutter signal is generated by global shutter circuitry included within the image sensor's control circuitry.

Figure 6:
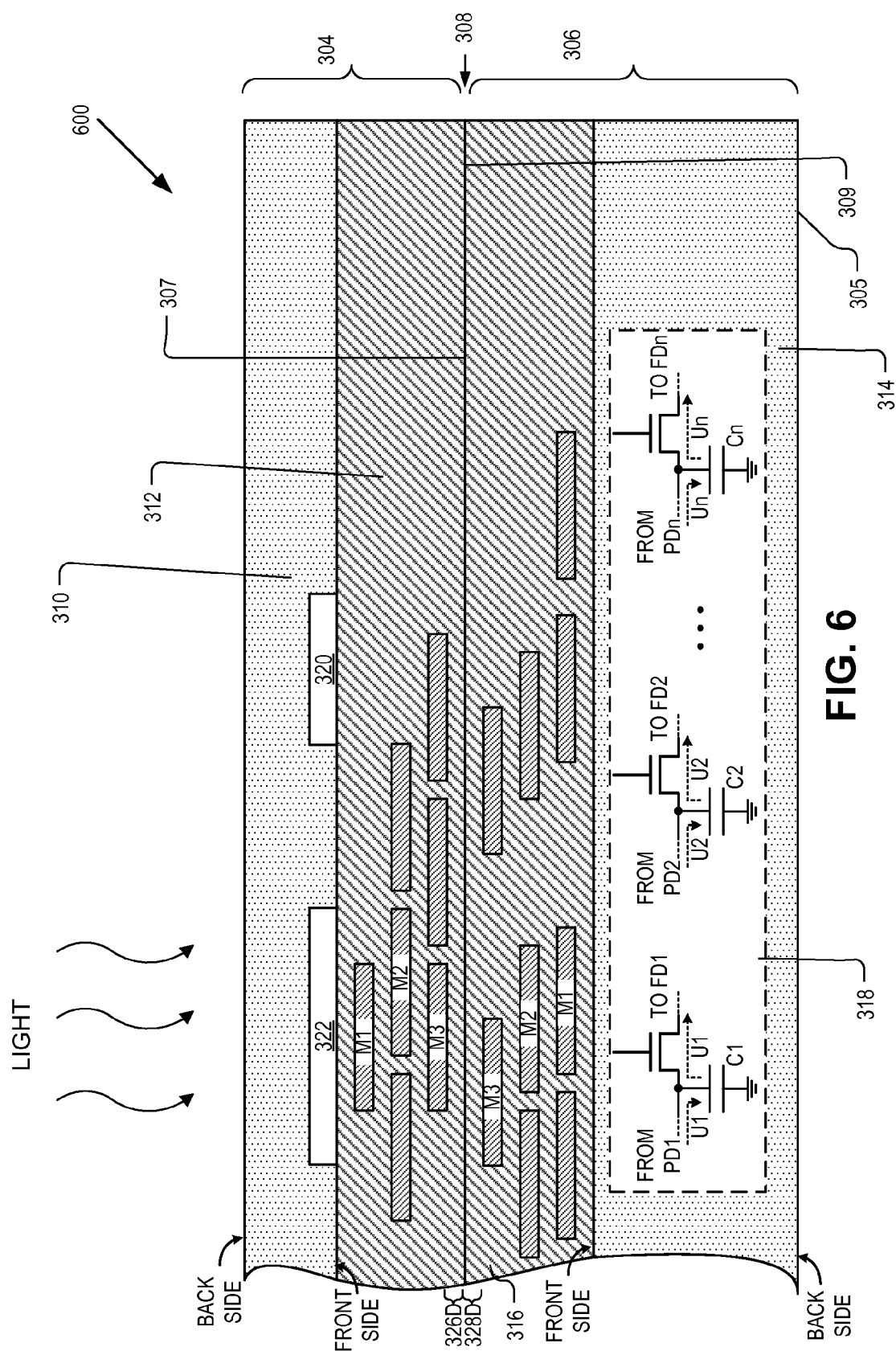
FIG. 6 is a hybrid cross sectional/circuit illustration of a backside illuminated imaging sensor system incorporating the pixel circuitry of FIG. 5.

FIG. 6 is a hybrid cross sectional/circuit illustration of a backside illuminated imaging sensor system 600 with a storage device 318, in accordance with an embodiment of the invention. The illustrated embodiment of imaging sensor system 600 is similar to the integrated circuit system 300 and illustrates further detail of an embodiment of storage device 318 having storage cells that each include a storage capacitor Cn and a control transistor CNTRL. In one embodiment, imaging array 322 includes an n number of pixels, where each pixel includes a photodiode region formed on the front side of semiconductor layer 310. Thus, the illustrated embodiment of storage device 318 includes at least n number of storage cells (i.e., storage capacitor and control transistor). Thus, storage device 318 includes, at least, one storage cell corresponding to each of the pixels included in imaging array 322.

As illustrated, imaging sensor system 600 is photosensitive to light incident on the backside of semiconductor layer 310. By using a backside illuminated sensor, the storage cells included in storage device 318 can be positioned below the imaging array 322, without obstructing light from reaching the imaging array 322. By placing storage capacitor C on device wafer 306, imaging array 322 and the storage cells do not compete for valuable die real estate. Rather, the storage capacitors C can be enlarged to increase their capacitance without detracting from the fill factor of the image sensor. Embodiments of the present invention enable high capacity storage capacitors C to be placed in close proximity to their respective photodiode region without decreasing the sensitivity of the pixel. Furthermore, the backside illumination configuration provides greater flexibility to route signals over the front side of semiconductor layer 310 within metal stacks 312 and 316 without interfering with light received by the imaging array 322. In one embodiment, the global shutter signal is routed within metal stack 312 to all the pixels within the imaging array 322. In one example, storage device 318 is electrically coupled to imaging array 322 and/or periphery circuitry 320 by way of both metal stacks 312 and 316.

Another advantage to placing storage device 318 on bottom device wafer 306, is the increased isolation from the incident photons. Photons reaching storage capacitors C and/or control transistors CNTRL can lead to increased leakage current. However, the majority of photons incident on the backside of device wafer 304 terminate within imaging array 322. Those photons that penetrate past imaging array 322 are further blocked by metal stacks 312 and 316.

Figure 7:
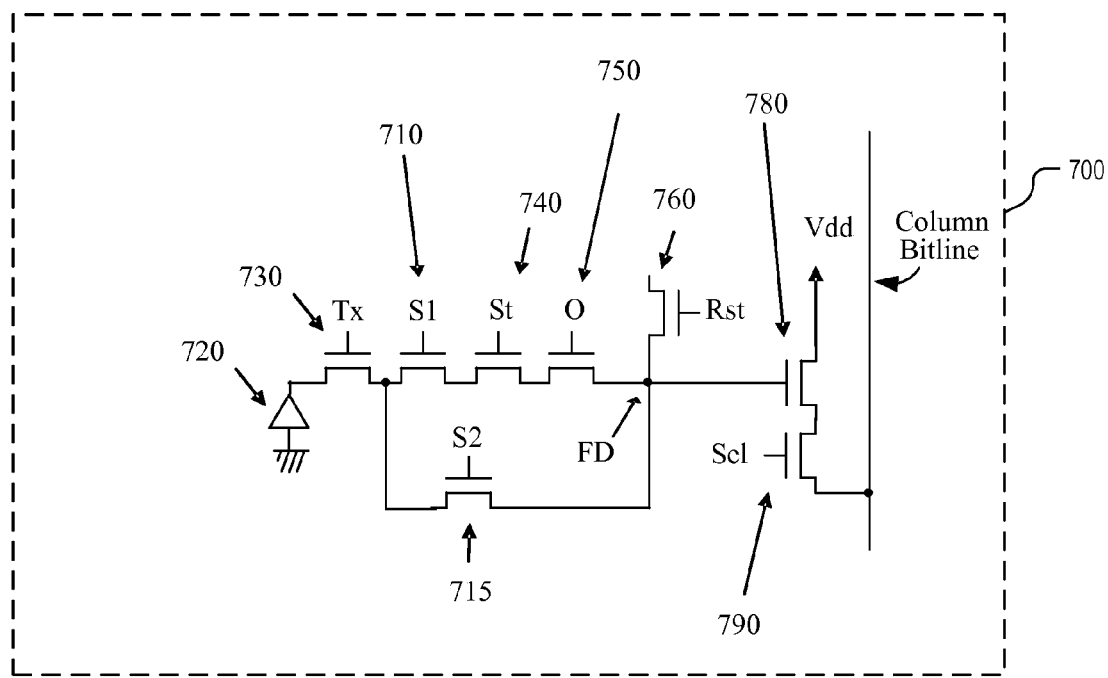
FIG. 7 is a circuit diagram illustrating pixel circuitry of a pixel within a backside illuminated imaging array including storage transistors, in accordance with an embodiment of the invention.

FIG. 7 is a circuit diagram illustrating pixel circuitry 700 of a seven or eight transistor pixel with a global shutter, in accordance with an embodiment of the invention. Pixel circuitry 700 is one possible architecture of pixel circuitry for implementing each pixel within an imaging array.

The illustrated embodiment of imaging pixel 700 includes a select 1 transistor 710, a select 2 transistor 715, a photodiode 720, a transfer transistor 730, a storage transistor 740, an output transistor 750, a reset transistor 760, an amplifier transistor 780, and a row-select transistor 790 (also referred to as a readout transistor). In one embodiment, the transistors, with the exception of transfer transistor 730, are sized similarly, which reduces space (required by the large shutter transistor of the conventional art) and increases the fill factor.

In one embodiment, photodiode 720 can be fully reset by selectively activating select 2 transistor 715 when the reset transistor 760 and transfer transistor 730 are activated. Select 2 transistor 715 is optional and may be used when applying a negative gate voltage to storage transistor 740.

In operation, a controller such as control circuitry can be used to control the pixel circuitry 700 as follows. Reset transistor 760 is coupled to a voltage source, such as Vdd. Reset transistor 760 is activated, which precharges node FD. Select 2 transistor 715 and transfer transistor 730 are activated, which precharges photodiode 720. Select 2 transistor 715 and transfer transistor 730 are deactivated, which allows photodiode 720 to integrate by accumulating photo-voltaically generated electrons during the image acquisition window. A negative voltage (e.g., −1.2 V) can be applied to the gate of storage transistor 740 before integration to accumulate holes in a region under the gate. After integration, transfer transistor 730 receives a transfer signal and select 1 transistor 710 and storage transistor 740 are activated, which transfers the charge accumulated in photodiode 720 to a storage transistor 740 where the charge is held until it is ready to be read out. In one embodiment, the gate of storage transistor 740 can be activated using a voltage of around 2.8 to 3.2 volts, for example.

When reset transistor 760 is deactivated, the charge present at the FD node is gradually reduced from leakage (e.g., due to dark current). The FD node is coupled to control the gate of amplifier transistor 780. The amplifier transistor 780 is coupled between the power rail Vdd and row select transistor 790. Amplifier transistor 780 operates as a source-follower. The "dark" voltage at the FD node can be measured by activating row select transistor 790 to selectively couple the output of pixel circuitry 700 to the readout column bitline under control of a select signal SEL. The "signal" charge (currently stored at storage transistor 740) can be read by activating output transistor 750, which couples the charge to the FD node, which in turn biases the gate of amplifier transistor 780 to produce a voltage that is coupled to the column bitline via row select transistor 790. In one embodiment, the row select transistor 790 can be omitted such that the drain of amplifier transistor 780 can be coupled directly to the column bitline. In this embodiment, amplifier transistor 780 may be referred to as the "readout transistor." When row select transistor 790 is present, it is referred to as the "readout transistor." In one embodiment, both amplifier transistor 780 and row select transistor 790 can be removed from imaging pixel 700, in which case output transistor 750 operates as the "readout transistor."

In one embodiment, the transfer signal, the reset signal, and the select signal are generated by control circuitry. In an embodiment where the imaging array operates with a global shutter, the global shutter signal (e.g., the Tx signal) is coupled to the gate of each transfer transistor 730 in the entire pixel array to simultaneously commence charge transfer from each pixel's photodiode 720. In one embodiment, the global shutter signal is generated by global shutter circuitry included within control circuitry. As such, transfer transistor 730 and the Tx signal provide the dual purpose of image shutter or shutter signal and charge transferer or transfer signal for reading out the image charge from photodiode 720. Furthermore, photodiode 720 is reset via transfer transistor 730 and select 2 transistor 715 (when present).

Figure 8:
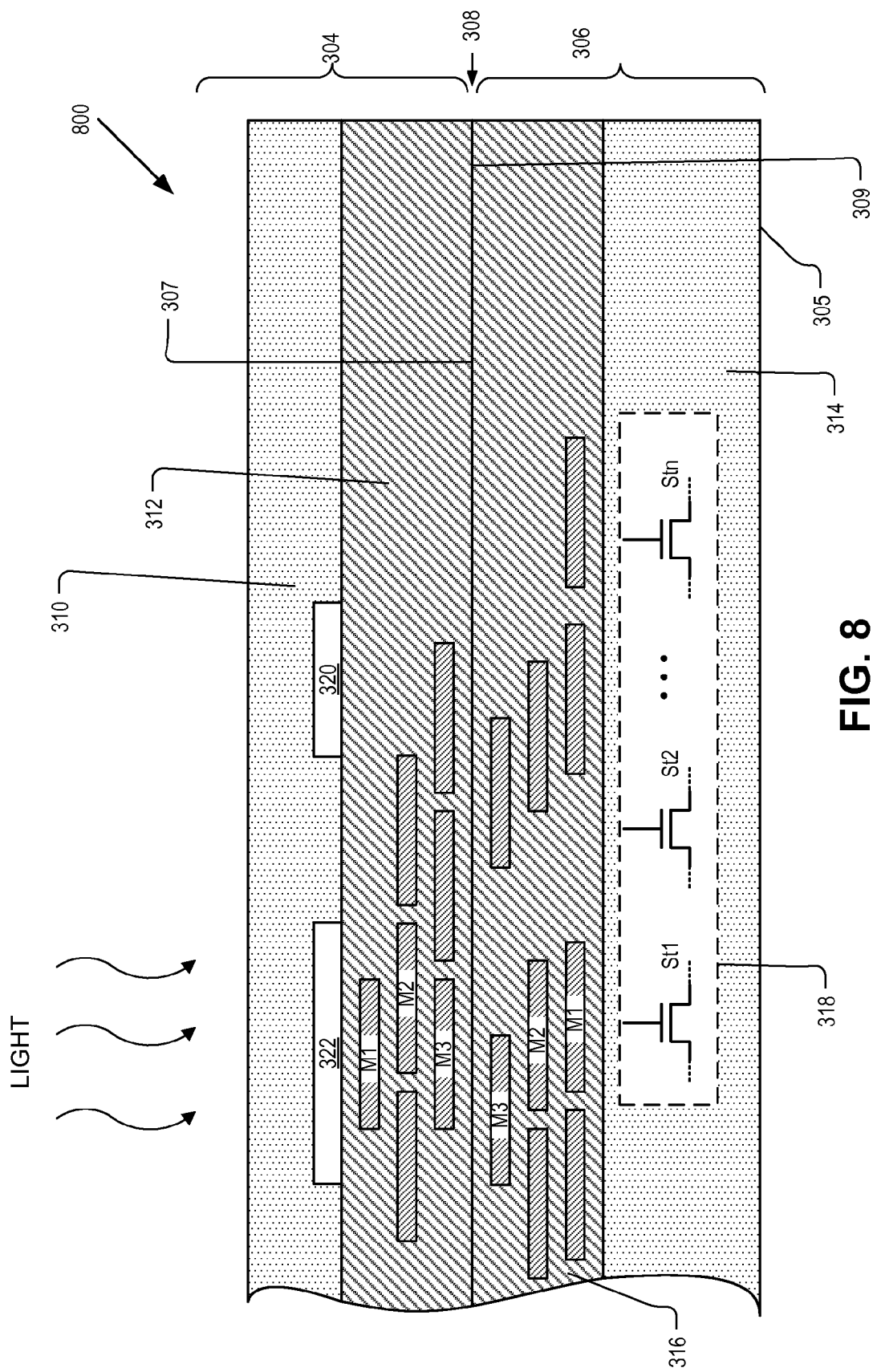
FIG. 8 is a hybrid cross sectional/circuit illustration of a backside illuminated imaging sensor system incorporating the pixel circuitry of FIG. 7.

FIG. 8 is a hybrid cross sectional/circuit illustration of a backside illuminated imaging sensor system 800 with a storage device 318, in accordance with an embodiment of the invention. The illustrated embodiment of imaging sensor system 800 is similar to the integrated circuit system 300 and illustrates further detail of an embodiment of storage device 318 having storage cells that each include a storage transistor St, as discussed above in FIG. 7. In one embodiment, imaging array 322 includes an n number of pixels, where each pixel includes a photodiode region formed on the front side of semiconductor layer 310. Thus, the illustrated embodiment of storage device 318 includes at least n number of storage cells (i.e., storage transistors St). Thus, storage device 318 includes, at least, one storage cell corresponding to each of the pixels included in imaging array 322.

As illustrated, imaging sensor system 600 is photosensitive to light incident on the backside of semiconductor layer 310. By using a backside illuminated sensor, the storage cells included in storage device 318 can be positioned below the imaging array 322, without obstructing light from reaching the imaging array 322. By placing storage transistors St on device wafer 306, imaging array 322 and the storage cells do not compete for valuable die real estate. Rather, the gates of storage transistors St can be enlarged to increase their capacitance without detracting from the fill factor of the image sensor. In one example, storage device 318 is electrically coupled to imaging array 322 and/or periphery circuitry 320 by way of both metal stacks 312 and 316.

Another advantage to placing storage device 318 on bottom device wafer 306, is the increased isolation from the incident photons. Photons reaching storage transistors St can lead to increased leakage current. However, the majority of photons incident on the backside of device wafer 304 terminate within imaging array 322. Those photons that penetrate past imaging array 322 are further blocked by metal stacks 312 and 316.

Figure 9:
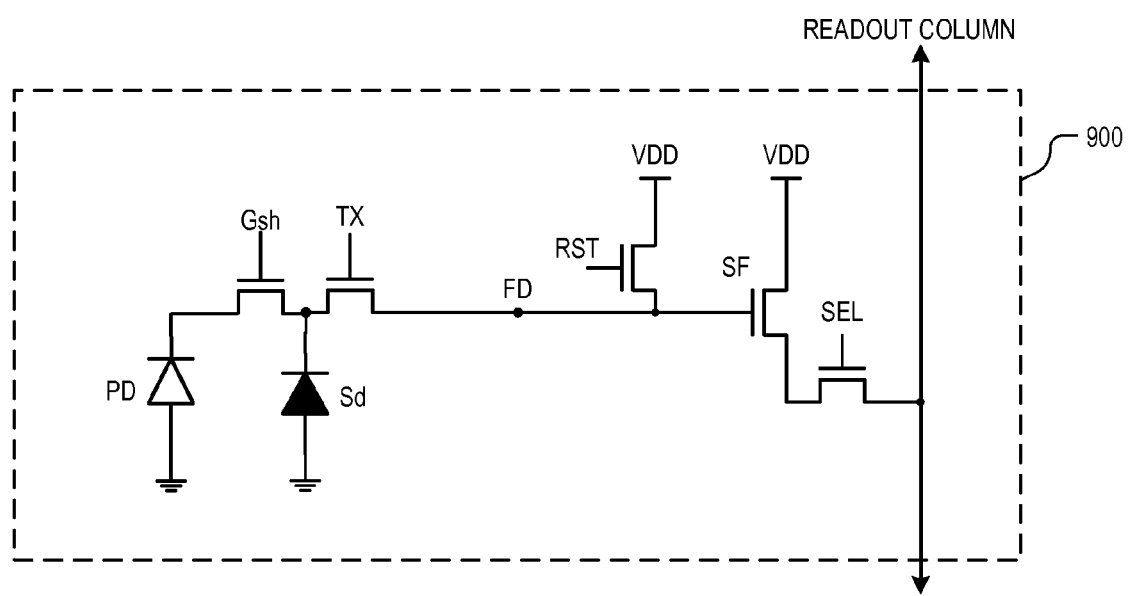
FIG. 9 is a circuit diagram illustrating pixel circuitry of a pixel within a backside illuminated imaging array including storage diodes, in accordance with an embodiment of the invention.

FIG. 9 is a circuit diagram illustrating pixel circuitry 900 of a pixel with a global shutter, in accordance with an embodiment of the invention. Pixel circuitry 900 is one possible architecture of pixel circuitry for implementing each pixel within an imaging array.

As illustrated, pixel circuitry includes a photodiode PD. In one embodiment, photodiode PD is a pinned photodiode having one doped layer for collecting charge generated from incident light and another doped pinning layer. A shutter gate Gsh transfers the accumulated charge to a second pinned diode or storage diode Sd for storing the transferred charge. A transfer gate TX transfers the charge to a sense node, preferably a floating diffusion FD, which is adjacent the storage diode Sd. The sense node (e.g., FD) converts the charge to a voltage which is then sensed by an amplifier, preferably a source follower SF. A reset transistor RST resets the floating diffusion FD to a reference voltage. An overflow drain (not shown) is adjacent the photodiode PD for draining excess charge from the photodiode PD.

Operation of pixel circuitry 900 involves using the shutter gate Gsh, the transfer gate TX, and the reset gate RST in combination to empty the photodiode PD. The reset gate RST also is used to reset the floating diffusion FD to a set bias greater than that of the photodiode PD and, in combination with the shutter gate Gsh, to empty all charge from the storage diode Sd. The shutter gate Gsh is turned on and the transfer gate TX is then turned off on all pixels to simultaneously to begin the shutter window. The signal from the incident light generates charge on the photodiode PD that is integrated on the storage diode Sd. To end the shutter window, the shutter gate Gsh is turned off and the signal charge is held on the storage diode Sd. The floating diffusion FD is then reset to a reference voltage by clocking the reset transistor RST on and off and the output is then readout. Then the transfer gate TX is turned on so that the signal charge is transferred to the floating diffusion FD and the output is readout. The image signal is the difference between the two readouts.

Figure 10:
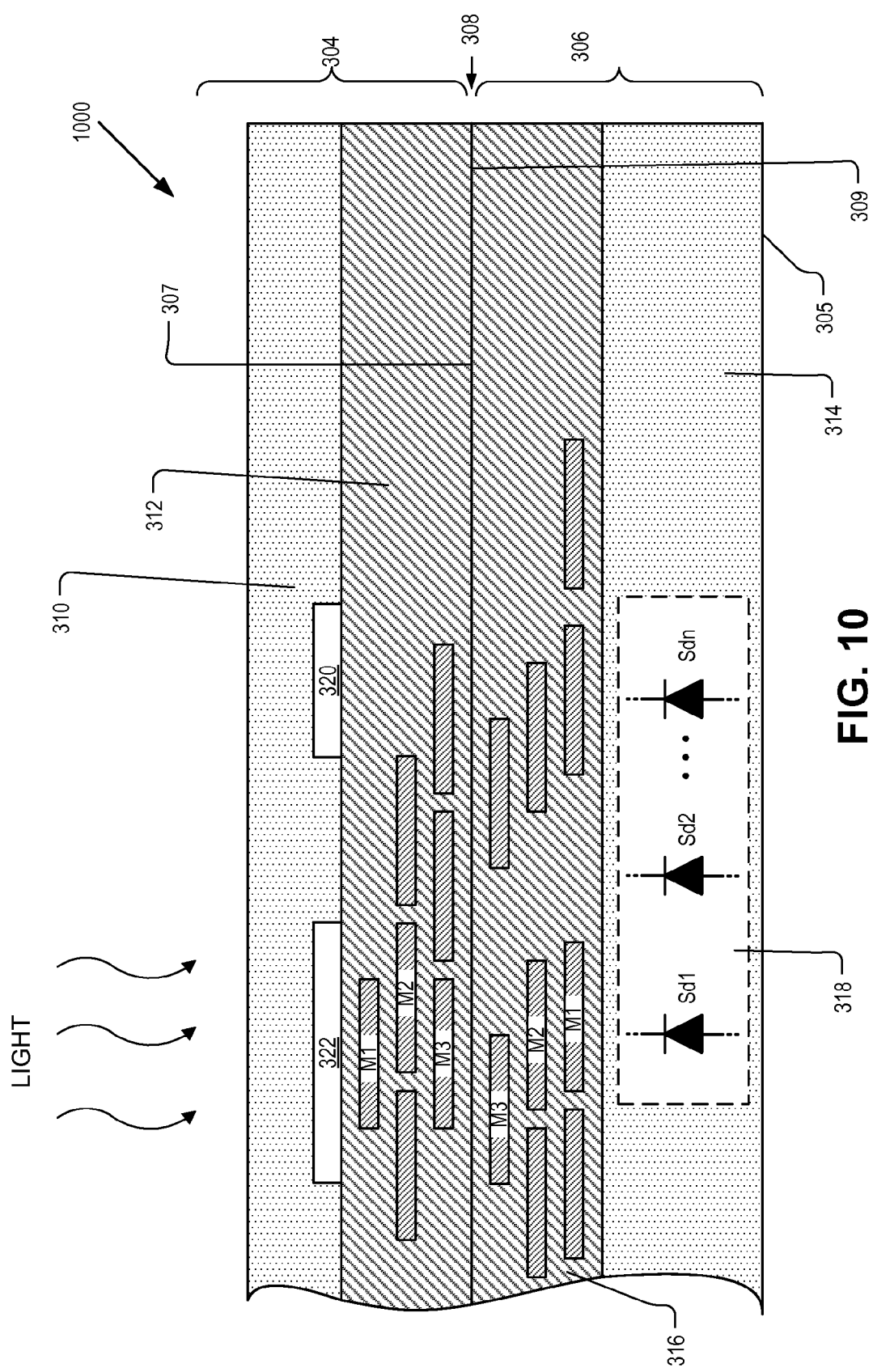
FIG. 10 is a hybrid cross sectional/circuit illustration of a backside illuminated imaging sensor system incorporating the pixel circuitry of FIG. 9.

FIG. 10 is a hybrid cross sectional/circuit illustration of a backside illuminated imaging sensor system 1000 with a storage device 318, in accordance with an embodiment of the invention. The illustrated embodiment of imaging sensor system 1000 is similar to the integrated circuit system 300 and illustrates further detail of an embodiment of storage device 318 having storage cells that each include a storage diode Sd, as discussed above in FIG. 9. In one embodiment, imaging array 322 includes an n number of pixels, where each pixel includes a photodiode region formed on the front side of semiconductor layer 310. Thus, the illustrated embodiment of storage device 318 includes at least n number of storage cells (i.e., storage diodes Sd). Thus, storage device 318 includes, at least, one storage cell corresponding to each of the pixels included in imaging array 322.

As illustrated, imaging sensor system 600 is photosensitive to light incident on the backside of semiconductor layer 310. By using a backside illuminated sensor, the storage cells included in storage device 318 can be positioned below the imaging array 322, without obstructing light from reaching the imaging array 322. By placing storage diodes Sd on device wafer 306, imaging array 322 and the storage cells do not compete for valuable die real estate. Rather, the storage diodes Sd can be enlarged to increase their storage capacity without detracting from the fill factor of the image sensor. In one example, storage device 318 is electrically coupled to imaging array 322 and/or periphery circuitry 320 by way of both metal stacks 312 and 316.

Another advantage to placing storage device 318 on bottom device wafer 306, is the increased isolation from the incident photons. Photons reaching storage diodes Sd can lead to increased leakage current. However, the majority of photons incident on the backside of device wafer 304 terminate within imaging array 322. Those photons that penetrate past imaging array 322 are further blocked by metal stacks 312 and 316.

Figure 11:
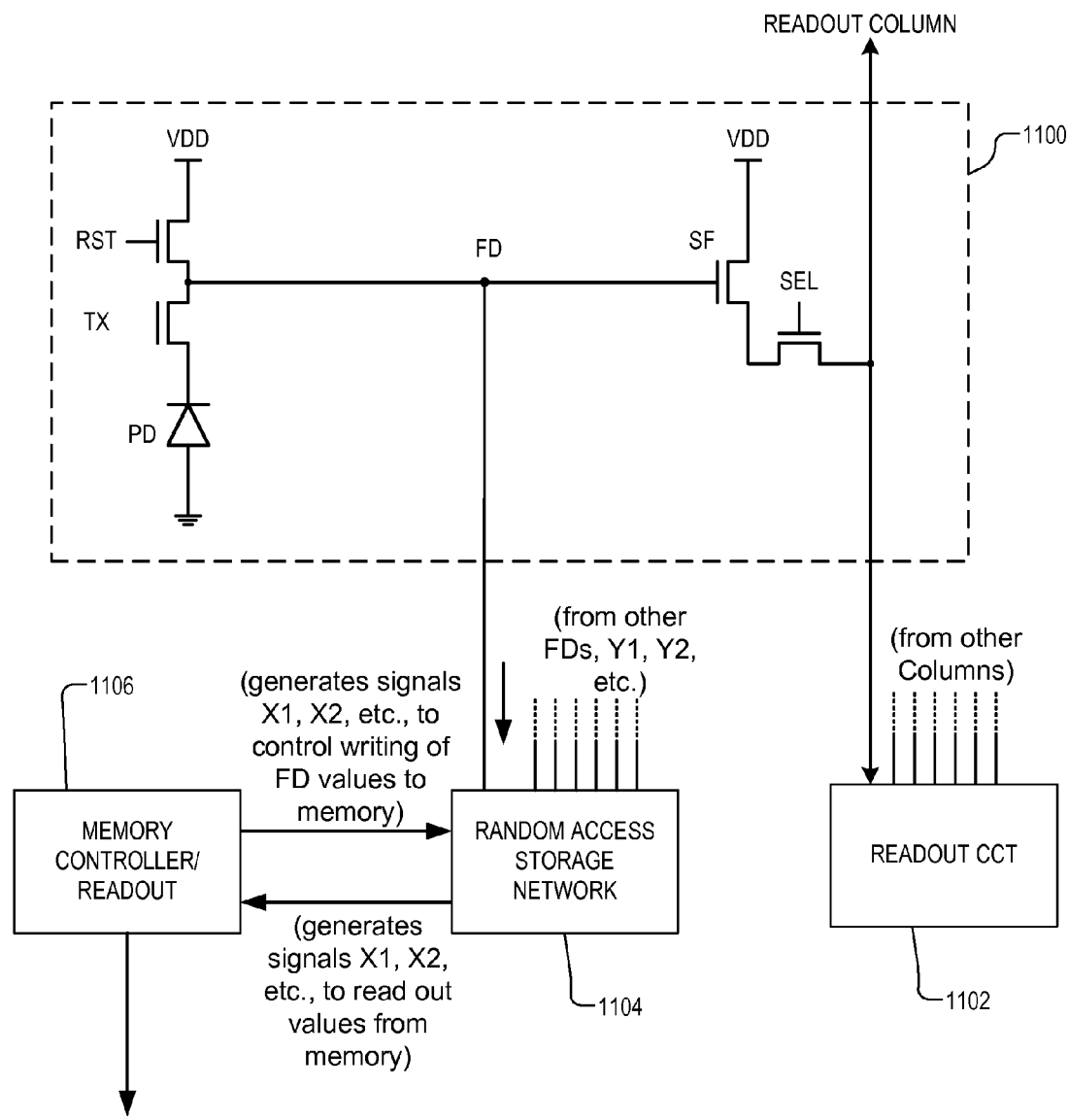
FIG. 11 is a circuit diagram illustrating pixel circuitry of a pixel within a BSI imaging array along with a global random access storage network coupled to the floating diffusion regions, in accordance with an embodiment of the invention.

FIG. 11 is a circuit diagram illustrating an embodiment of pixel circuitry 1100 of a pixel within a BSI imaging array along with a global random access storage network 1104, in accordance with an embodiment of the invention. Pixel circuitry 1100 is one possible pixel circuitry architecture for implementing each pixel within an imaging array (e.g., pixel array 1305 of FIG. 13), but it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 11, each pixel circuitry 1100 includes a photodiode PD, a transfer transistor T1, a reset transistor T2, a source-follower ("SF") transistor T3, and a select transistor T4. Pixel circuitry 1100 couples and operates similar to pixel circuitry 400 of FIG. 4. However, as shown in FIG. 11, in this embodiment, each floating diffusion FD is coupled to the global random access storage network 1104 that receives and stores image charge read out from each photodiode region PD of the imaging array.

Random access storage network 1104 is one possible implementation of storage device 318 of FIG. 2 and is positioned within the bottom device wafer 308, such that the light sensitive elements of the random access storage network are substantially shielded from light that is incident on the backside of the top device wafer 304.

In one embodiment, random access storage network 1104 includes the random access memory network of FIG. 3. Thus, in this embodiment, each of the Y lines (e.g., Y1, Y2, . . . , Yn) are coupled to a floating diffusion region of a corresponding pixel included in the imaging array. Similarly, each of the X lines (e.g., X1, X2, etc.) are coupled to memory controller/readout circuit 1106. Memory controller/readout circuit 1106 is coupled to generate signals to control both write and read operations of the random access storage network 1104. The random access storage network 1104 allows signals from each photodiode region to be stored simultaneously, while also allowing each stored signal to be read out individually and in any order.

Figure 12:
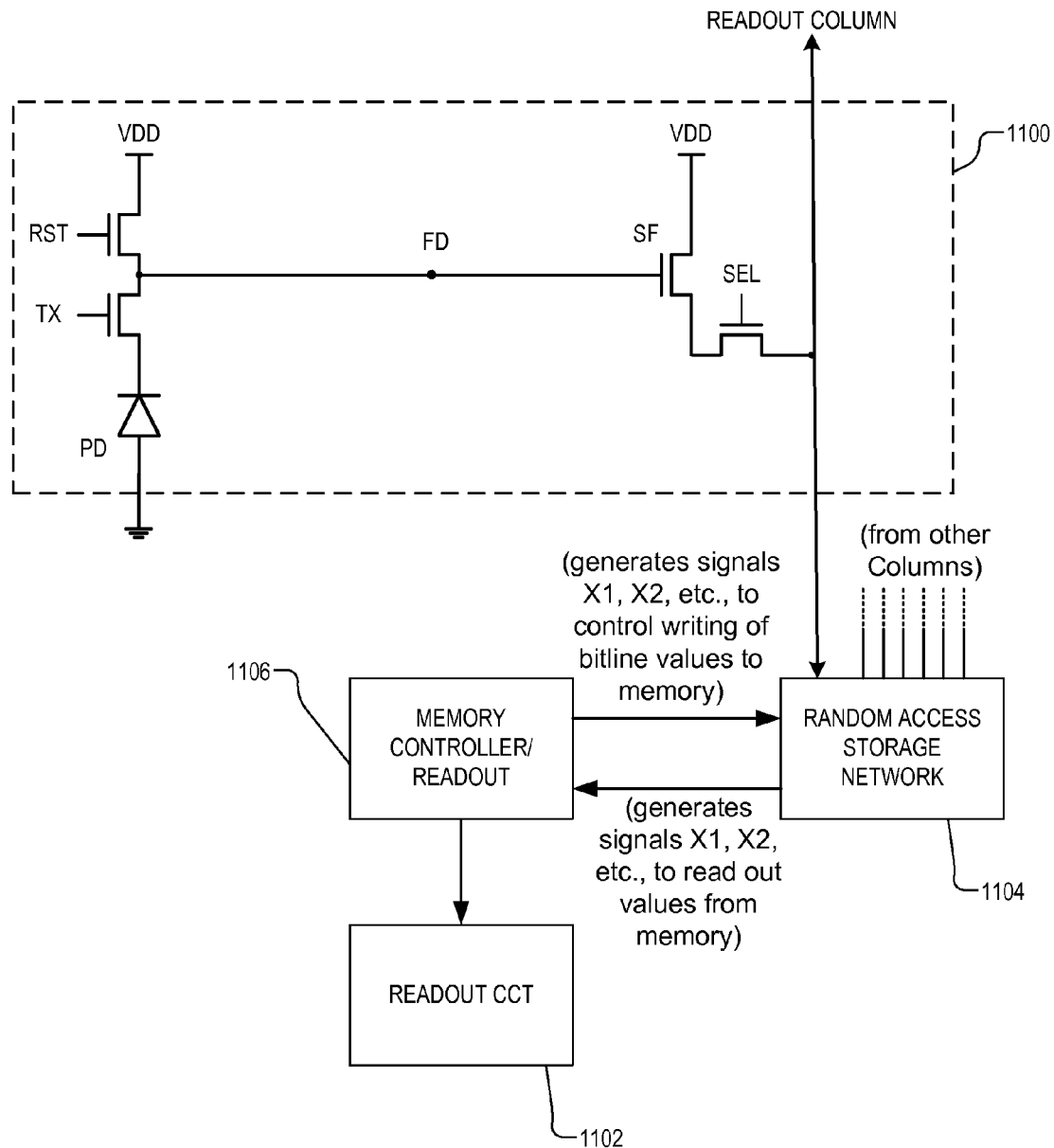
FIG. 12 is a circuit diagram illustrating pixel circuitry of a pixel within a BSI imaging array along with a global random access storage network coupled to the column readout lines, in accordance with an embodiment of the invention.

FIG. 12 is a circuit diagram illustrating an embodiment of pixel circuitry 1100 of a pixel within a BSI imaging array along with a global random access storage network 1104 coupled to the column readout lines, in accordance with an embodiment of the invention. Pixel circuitry 1100 couples and operates similar to that described with reference to FIG. 11. However, as shown in FIG. 12, in this embodiment, instead of coupled to each floating diffusion FD, the global random access storage network 1104 is coupled to each column readout line of the imaging array to receive and store image charge read out from each floating diffusion FD of the imaging array.

In one embodiment, random access storage network 1104 includes the random access memory network of FIG. 3. Thus, in this embodiment, each of the Y lines (e.g., Y1, Y2, . . . , Yn) are coupled to a column readout line (i.e., bitline) of a column of pixels included in the imaging array. Similarly, each of the X lines (e.g., X1, X2, etc.) are coupled to memory controller/readout circuit 1106. The random access storage network 1104 allows signals from each floating diffusion region to be stored simultaneously, while also allowing each stored signal to be read out individually in any order.

Figure 13:
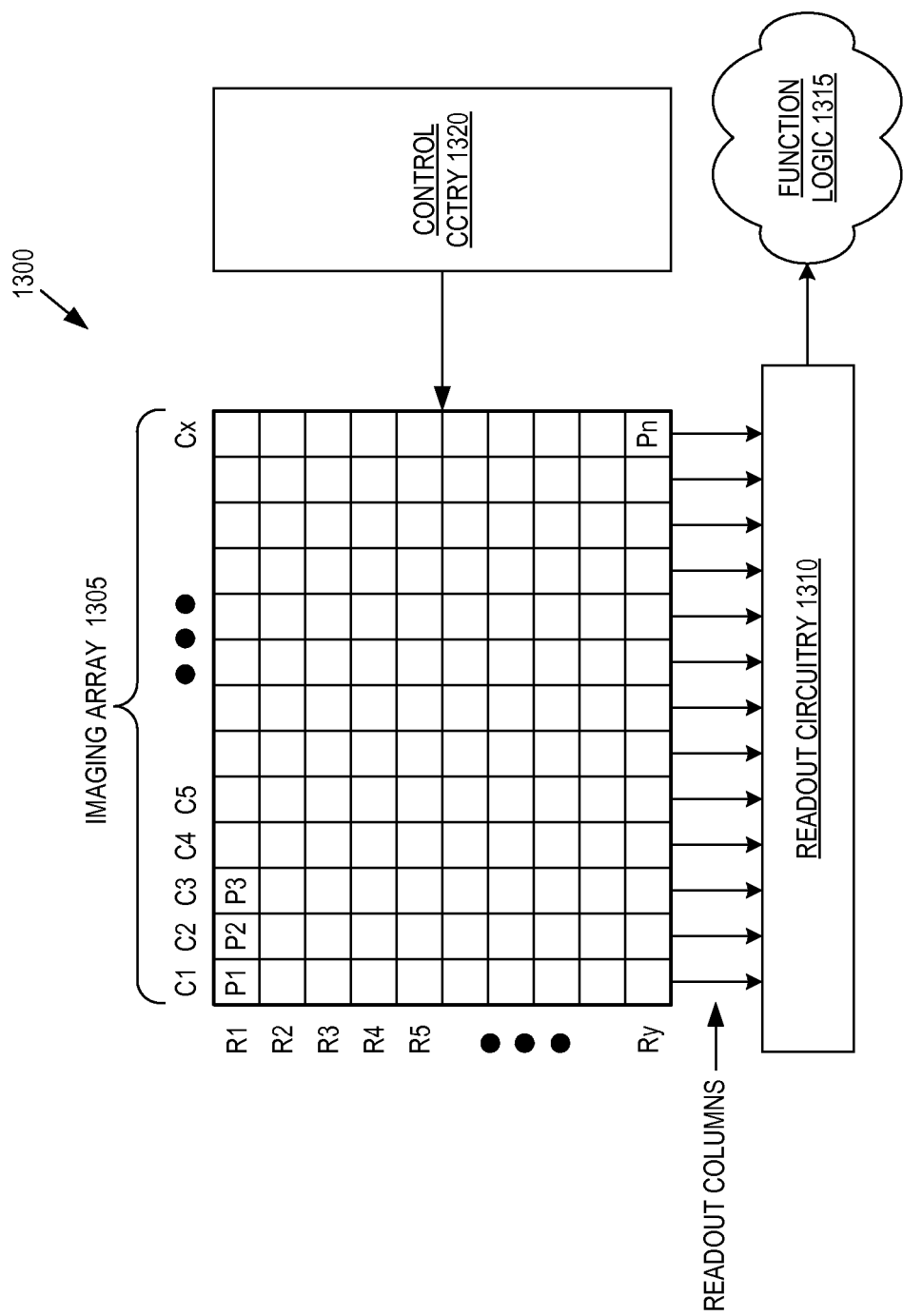
FIG. 13 is a functional block diagram illustrating an embodiment of a CMOS image sensor, in accordance with an embodiment of the invention.

FIG. 13 is a functional block diagram illustrating an embodiment of a CMOS image sensor 1300, in accordance with an embodiment of the invention. CMOS image sensor 1300 may be one implementation of at least one of the semiconductor devices mentioned previously, including device 300. The illustrated embodiment of image sensor 1300 includes a imaging array 1305, readout circuitry 1310, function logic 1315, and control circuitry 1320.

Imaging array 1305 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is read out by readout circuitry 1310 and transferred to function logic 1315. Readout circuitry 1310 can include amplification circuitry, analog-to-digital ("ADC") conversion circuitry, or otherwise. Function logic 1315 can simply store the image data or even manipulate the image data by applying post image effects (e.g., crop, rotate, remove red eye, adjust brightness, adjust contrast, or otherwise). Control circuitry 1320 is coupled to pixel array 1305 to control operational characteristic of pixel array 1305.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging sensor system, comprising:
   a first semiconductor layer of a first wafer;
   a complementary metal oxide semiconductor (CMOS) imaging array formed in the first semiconductor layer, wherein the CMOS imaging array includes an N number of pixels, each pixel including a photodiode region formed in a front side of the first semiconductor layer, and wherein the photodiode region is configured to received light from a backside of the first semiconductor layer;
   a first metal stack disposed on the front side of the first semiconductor layer;
   a second semiconductor layer of a second wafer;
   a second metal stack disposed on the second semiconductor layer, wherein the first wafer is bonded to the second wafer at a bonding interface between the first metal stack and the second metal stack; and
   a storage device formed directly below the CMOS imaging array in the second semiconductor layer and electrically coupled to the CMOS imaging array by way of the first and second metal stacks, wherein the storage device includes at least N number of storage cells, wherein each of the N number of storage cells are configured to store a signal representative of image charge accumulated by a respective photodiode region and wherein each of the N number of storage cells includes a light-sensitive circuit element that is sensitive to light-induced leakage;
   wherein the CMOS imaging array, the first metal stack, and the second metal stack are configured to prevent substantially all light from reaching the light-sensitive circuit elements.

2. The imaging sensor system of claim 1, wherein each pixel of the CMOS imaging array further comprises a floating diffusion region formed in the first semiconductor layer, wherein the floating diffusion region is selectively coupled to a respective photodiode for converting the accumulated image charge to a voltage signal.

3. The imaging sensor system of claim 2, wherein each light-sensitive circuit element comprises a light-sensitive storage transistor to store the signal representative of the image charge.

4. The imaging sensor system of claim 2, wherein each light-sensitive circuit element comprises a light-sensitive pinned photodiode to store the signal representative of the image charge.

5. The imaging sensor system of claim 2, wherein each of the N number of storage cells includes a light-sensitive storage capacitor to store the signal representative of the image charge, and wherein each light-sensitive circuit element comprises a control transistor coupled to a respective light-sensitive storage capacitor to control the transfer of the stored signal out of the storage capacitor.

6. The imaging sensor system of claim 1, wherein:
   the first metal stack includes at least one first metal layer and at least one first dielectric layer,
   the second metal stack includes at least one second metal layer and at least one second dielectric layer, and
   the bonding interface includes an interface between the first dielectric layer and the second dielectric layer.

7. An integrated circuit system, comprising:
   a first wafer having a plurality of first dies, each first die including:
     a complementary metal oxide semiconductor (CMOS) imaging array formed in a first semiconductor layer, wherein the CMOS imaging array includes an N number of pixels, each pixel including a photodiode region formed in a front side of the first semiconductor layer, and wherein the photodiode region is configured to received light from a backside of the first semiconductor layer;
     a first metal stack disposed on the front side of the first semiconductor layer; and
   a second wafer having a plurality of second dies, each second die including:
     a second metal stack disposed on a second semiconductor layer, wherein the first wafer is bonded to the second wafer at a bonding interface between the first metal stack and the second metal stack; and
     a storage device formed directly below the CMOS imaging array in the second semiconductor layer and electrically coupled to the CMOS imaging array by way of the first and second metal stacks, wherein the storage device includes at least N number of storage cells, wherein each of the N number of storage cells are configured to store a signal representative of image charge accumulated by a respective photodiode region and wherein each of the N number of storage cells includes a light-sensitive circuit element that is sensitive to light-induced leakage;
   wherein the CMOS imaging array, the first metal stack, and the second metal stack are configured to prevent substantially all light from reaching the light-sensitive circuit elements.

8. The integrated circuit system of claim 7, wherein each pixel of the CMOS imaging array further comprises a floating diffusion region formed in the first semiconductor layer, wherein the floating diffusion region is selectively coupled to a respective photodiode for converting the accumulated image charge to a voltage signal.

9. The integrated circuit system of claim 8, wherein each light-sensitive circuit element comprises a light-sensitive storage transistor to store the signal representative of the image charge.

10. The integrated circuit system of claim 8, wherein each light-sensitive circuit element comprises a light-sensitive pinned photodiode to store the signal representative of the image charge.

11. The integrated circuit system of claim 8, wherein each of the N number of storage cells includes a light-sensitive storage capacitor to store the signal representative of the image charge, and wherein each light-sensitive circuit element comprises a control transistor coupled to a respective light-sensitive storage capacitor to control the transfer of the stored signal out of the storage capacitor.

12. The integrated circuit system of claim 7, wherein:
the first metal stack includes at least one first metal layer and at least one first dielectric layer,
the second metal stack includes at least one second metal layer and at least one second dielectric layer, and
the bonding interface includes an interface between the first dielectric layer and the second dielectric layer.

* * * * *